(12) United States Patent
Kresge et al.

(10) Patent No.: US 11,009,202 B2
(45) Date of Patent: May 18, 2021

(54) UNIVERSAL DUAL INFRARED AND WHITE LIGHT BULB

(71) Applicant: Battelle Memorial Institute, Columbus, OH (US)

(72) Inventors: Keith Kresge, Columbus, OH (US); Alan Roach, Escondido, CA (US)

(73) Assignee: BATTELLE MEMORIAL INSTITUTE, Columbus, OH (US)

( * ) Notice: Subject to any disclaimer, the term of this patent is extended or adjusted under 35 U.S.C. 154(b) by 0 days.

(21) Appl. No.: 16/998,387

(22) Filed: Aug. 20, 2020

(65) Prior Publication Data
US 2020/0378573 A1 Dec. 3, 2020

Related U.S. Application Data

(63) Continuation of application No. 15/981,513, filed on May 16, 2018, now Pat. No. 10,781,985.

(60) Provisional application No. 62/507,573, filed on May 17, 2017.

(51) Int. Cl.
| | |
|---|---|
| *F21S 41/13* | (2018.01) |
| *H05K 1/18* | (2006.01) |
| *F21S 41/141* | (2018.01) |
| *B60R 1/06* | (2006.01) |
| *F21S 41/19* | (2018.01) |
| *F21S 41/148* | (2018.01) |
| *F21S 41/663* | (2018.01) |
| *F21S 45/47* | (2018.01) |
| *F21W 102/13* | (2018.01) |

(52) U.S. Cl.
CPC ............... *F21S 41/13* (2018.01); *B60R 1/06* (2013.01); *F21S 41/141* (2018.01); *F21S 41/148* (2018.01); *F21S 41/192* (2018.01); *F21S 41/663* (2018.01); *F21S 45/47* (2018.01); *H05K 1/181* (2013.01); *F21W 2102/13* (2018.01)

(58) Field of Classification Search
CPC ........ F21S 41/13; F21S 41/663; F21S 41/148; F21S 41/192; F21S 41/141; F21S 45/47; B60R 1/06; H05K 1/181
USPC ......................................................... 362/459
See application file for complete search history.

(56) References Cited

U.S. PATENT DOCUMENTS

| | | | |
|---|---|---|---|
| 4,176,265 A | 11/1979 | Mobus | |
| 8,322,896 B2 * | 12/2012 | Falicoff | F21V 3/12 |
| | | | 362/363 |
| 8,502,468 B2 | 8/2013 | Li | |
| 8,696,156 B2 | 4/2014 | Yuan | |

(Continued)

FOREIGN PATENT DOCUMENTS

| | | |
|---|---|---|
| CN | 202691851 U | 1/2013 |
| DE | 102007015233 A1 | 10/2008 |

(Continued)

*Primary Examiner* — Bryon T Gyllstrom
(74) *Attorney, Agent, or Firm* — Fay Sharpe LLP

(57) ABSTRACT

A dual-illumination unit that combines one or more visible LEDs and one or more IR LEDs in the same unit. The LEDs are mounted to circuit boards resembling a standard lightbulb shape, supported by a housing, the housing encapsulating electronic components controlling the LEDs and configured to be connected to standard OEM fusebox power. The unit also includes an adapter ring, removably coupled to the housing and configured to secure the unit to an original equipment manufacturer (OEM) headlight assembly of an associated vehicle.

13 Claims, 13 Drawing Sheets

(56) References Cited

U.S. PATENT DOCUMENTS

| | | | |
|---|---|---|---|
| 2002/0071275 A1* | 6/2002 | Worgan | H05K 5/0017 362/247 |
| 2004/0105264 A1* | 6/2004 | Spero | B60Q 1/04 362/276 |
| 2004/0174712 A1* | 9/2004 | Yagi | B60Q 1/14 362/475 |
| 2004/0190291 A1* | 9/2004 | Chliwnyj | H05B 45/10 362/240 |
| 2004/0201996 A1 | 10/2004 | Weber | |
| 2005/0254264 A1* | 11/2005 | Sidwell | F21S 43/14 362/655 |
| 2005/0264035 A1 | 12/2005 | Brass | |
| 2005/0265035 A1* | 12/2005 | Brass | F21V 17/12 362/451 |
| 2006/0109672 A1 | 5/2006 | Sasaki et al. | |
| 2008/0008620 A1* | 1/2008 | Alexiadis | F21S 4/26 422/24 |
| 2008/0094857 A1* | 4/2008 | Smith | H05B 45/20 362/649 |
| 2012/0126699 A1* | 5/2012 | Zittel | F21V 3/00 315/86 |
| 2013/0294092 A1* | 11/2013 | Hussell | F21K 9/238 362/363 |
| 2014/0292176 A1* | 10/2014 | Athalye | F21K 9/232 313/46 |
| 2016/0259116 A1* | 9/2016 | Van Bommel | F21S 41/148 |

FOREIGN PATENT DOCUMENTS

| | | |
|---|---|---|
| DE | 102013213783 A1 | 1/2015 |
| EP | 1270325 A2 | 1/2003 |
| RU | 2602597 C1 | 11/2016 |
| WO | WO 2012/151522 A1 | 11/2012 |
| WO | WO 2015/091462 A1 | 6/2015 |

* cited by examiner

UNIVERSAL DUAL INFRARED AND WHITE LIGHT BULB

CROSS-REFERENCE TO RELATED APPLICATIONS

This application claims priority to U.S. Provisional Patent Application Ser. No. 62/507,573, filed May 17, 2017, titled Universal Dual Infrared and White Light Bulb, and U.S. patent application Ser. No. 15/981,513, filed May 16, 2018, titled Universal Dual Infrared and White Light Bulb, the entire disclosures of which are incorporated by reference herein.

BACKGROUND

The following relates generally to the illumination arts, the tracking arts, the surveillance arts, the law enforcement arts, the military arts, the night vision arts, and the like. It finds particular application in association with the low-light level illumination and detection arts for surveillance.

Previously known headlamps used in tactical vehicles include incandescent, sealed beam headlamps that exhibit poor performance characteristics when compared to current automotive lighting systems. These headlamps can be interchangeable with other headlamp systems which may be needed for covert operations. These accessory headlamps usually include a first incandescent bulb lamp and a second incandescent bulb lamp covered by a filter so as to pass only infrared light. However, these headlamps require an operator to switch from one or the other of the bulbs in order to produce visible or infrared illumination as needed.

Many military or tactical "blackout" operations require vehicle operation at night and at a moderate high speed without enemy detection. Previously known blackout lights deployed on tactical or military vehicles provide a small amount of visible light illumination, usually directly in front of the vehicle bumper. However, the low illumination supplied by prior art lights is considered especially ineffective when driving at higher speeds.

Moreover, military or tactical operations often utilize commandeered or seized vehicles. In this case, such operations also require that the commandeered or seized vehicle be operated at night, at high speed, and without enemy detection. However, these seized vehicles are not ordinarily equipped with covert infrared light capability and are also not readily adapted to receive known accessory covert headlamps, filters/lenses, and/or blackout lights.

It is generally considered highly advantageous to provide infrared (IR) illumination in a field of view as opposed to relying on infrared produced by objects in the field of view, as this dramatically increases the effectiveness of night vision goggles. However, the previous use of incandescent lamps and blackout filters/lenses to produce IR illumination is inefficient, since the lamp still produces visible light, and only a small portion of the radiation produced by the lamp is passed as IR. Additionally, it is difficult to block all visible light, and these previous systems require that the filter/lens be mechanically moved into place. As a result, the switch between visible and IR illumination is disadvantageously a time consuming process. Furthermore, these prior art systems do not maintain an unmodified OEM appearance, which potentially jeopardizes operations that require covertness. Use of IR only illumination devices on such non-military vehicles required the magnetic or other adhesion means to secure battery-powered devices on the front of the vehicle, resulting in a non-OEM appearance.

It would be desirable to provide a new light bulb that supplies both visible light and IR illumination at sufficient intensity for nighttime vehicle operation at high speeds, with the ability to be universally installed on many different vehicle makes and models such that an original OEM appearance is maintained.

BRIEF DESCRIPTION

According to one embodiment, there is provided a dual-illumination unit, comprising at least one visible light LED and at least one infrared (IR) LED. The unit further includes a housing to which the at least one visible light LED and the at least one infrared LED are affixed. The unit also includes an adapter ring, removably coupled to the housing and configured to secure the unit to an original equipment manufacturer (OEM) headlight assembly of an associated vehicle.

In accordance with another embodiment, there is provided a dual-illumination unit, that comprises an illumination component including at least one visible light LED and at least one infrared (IR) LED. The dual-illumination unit further comprises a housing to which the illumination component is affixed, the housing storing at least one electronic component operable to control operations of the at least one visible light LED and the at least one IR LED.

In yet another embodiment, there is provided a dual-illumination unit that comprises a housing, which stores at least one electronic component operable to control operations of the dual-illumination unit. The dual-illumination unit further includes an LED tower extending outward from the housing, the LED tower having at least one circuit board affixed thereto, wherein the at least one circuit board includes at least one visible light LED and at least one infrared LED.

In still another embodiment, there is provided a dual-illumination unit that comprises at least one circuit board including at least one visible light LED and at least one infrared (IR) LED. The unit further includes an LED tower to which the at least one circuit board is affixed, and a housing coupled to the LED tower, the housing storing at least one electronic component operable to control operations of the at least one visible light LED and the at least one IR LED.

According to one aspect of the varying embodiments, the electronic components are operable to receive control signals from an associated vehicle, the control signal corresponding to a low-beam and a high-beam signals. Furthermore, the electronic components actuate the at least one visible light LED responsive to a low-beam signal, and actuate the at least one IR LED responsive to a high-beam signal.

BRIEF DESCRIPTION OF THE DRAWINGS

The subject disclosure may take form in various components and arrangements of component, and in various steps and arrangement of steps. The drawings are only for purposes of illustrating the preferred embodiments and are not to be construed as limiting the subject disclosure.

DETAILED DESCRIPTION

Figure 1:
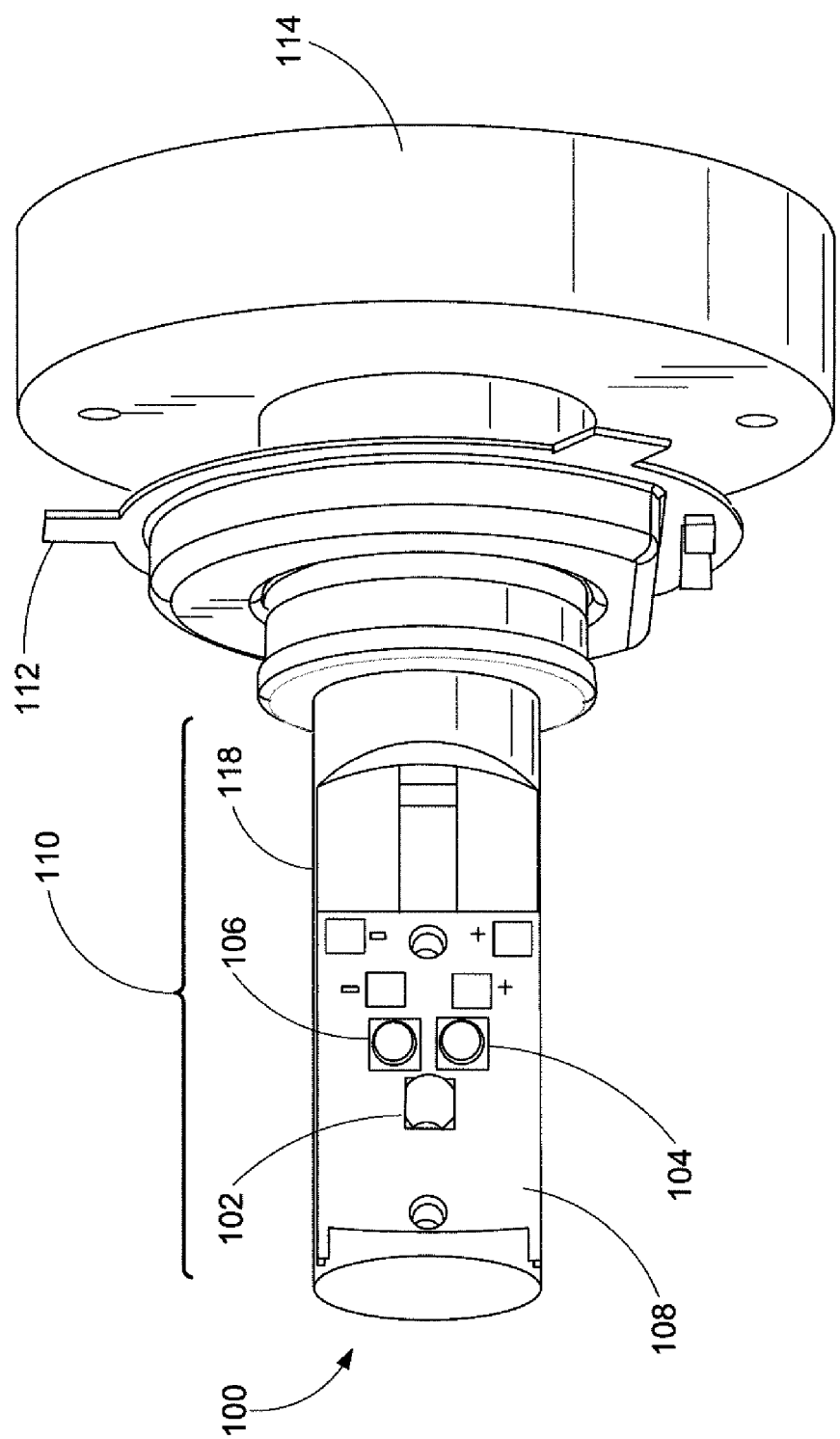
FIG. 1 is a three-dimensional representation of a dual-illumination unit in accordance with one embodiment of the subject application.

One or more embodiments will now be described with reference to the attached drawings, wherein like reference numerals are used to refer to like elements throughout. In accordance with one aspect, a dual-illumination unit of the subject application provides a universal IR light kit that utilizes surface mounted LEDs that output the desired amount of infrared (IR) light to provide improved vision for operators when using Night Vision Goggles (NVGs). The dual-illumination unit further utilizes white LEDs to replace the original headlight bulbs when standard white lighting is required during driving scenarios. Thus, the dual-illumination unit of the subject application enables the unit to be installed in the original light location, without the need to reconfigure or switch out the unit for normal (non-NVG-based) driving, while maintaining an unmodified original equipment manufacturer (OEM) appearance.

According to one aspect, there is provided a dual-illumination unit to provide covert IR light capability on vehicles which were not originally equipped with such capability.

In another embodiment, the dual-illumination unit provides concealed/covert IR lighting to any motor vehicle. According to such an embodiment, the dual-illumination unit combines white and IR lighting on a single component, requiring a single component replacement in an OEM vehicle. A removable adapter ring is attached to the unit to accommodate different bulb sizes between vehicles. Power can be sourced to the unit from the vehicle fusebox (e.g., using standard wiring harness, or the like), along with ground from the OEM ground point. Accordingly, the unit utilizes the original light fuse, allowing the original headlight (or foglight) switch to be used to control the output of the unit. Furthermore, as the unit utilizes a metal base, such as aluminum or the like, to house the integrated control and power electronic components, the unit provides passive cooling.

Figure 2:
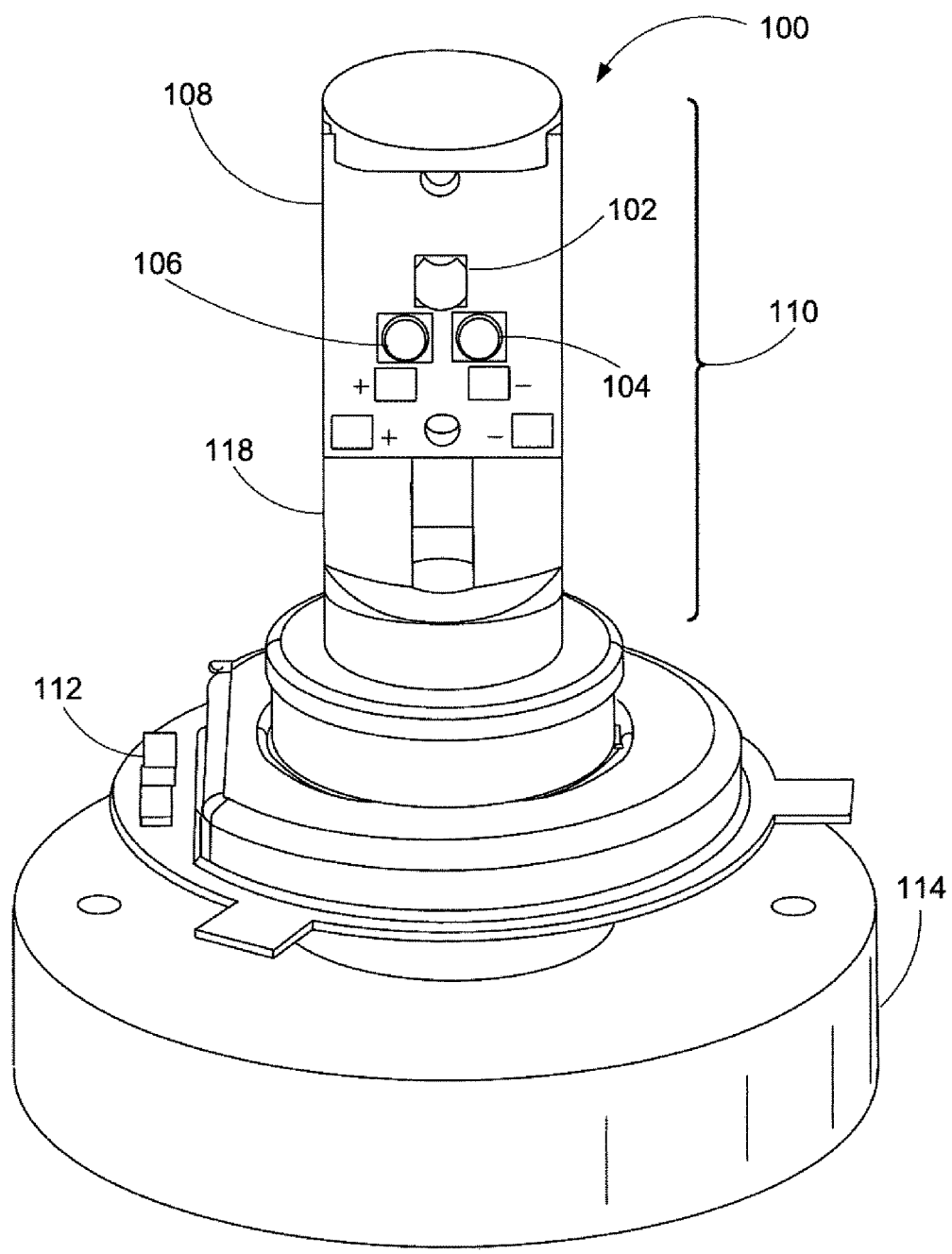
FIG. 2 is an alternate view of the three-dimensional representation of the dual-illumination unit of FIG. 1.

Turning now to FIGS. 1 and 2, there is shown a three-dimensional view of a dual-illumination unit 100 in accordance with one exemplary embodiment of the subject application. During discussion of FIGS. 1-2, reference will also be made to FIGS. 3A-3E, which illustrate varying views of the dual-illumination unit 100 depicted in FIGS. 1-2. It will be appreciated that the unit 100 illustrated in FIGS. 1-3E is representative of a particular implementation of the dual-illumination system of the subject application, and other implementations are contemplated herein.

Accordingly, as depicted in FIGS. 1-3E, the dual-illumination unit 100 includes an illuminating component 110, an adapter ring 112, and a base component or housing 114. The illuminating component 110 shown in FIGS. 1 and 2 illustrates a first side of the unit 100, including a first LED 102 for visible illumination and two LEDs 104-106 for infrared illumination (hereinafter IR LEDs 104-106) coupled to the circuit board 108. It will be understood that the use of LEDs is intended to exemplify the subject application, and the skilled artisan will appreciate that the use of other illumination sources, e.g., OLEDs, PLEDs, Laser SMDs, non smd-LEDs, or the like, are also capable of being utilized in the dual-illumination unit 100. Accordingly, the reference to LEDs is intended as a non-limiting example of such illumination sources. The circuit board 108 is affixed to an LED tower 118, extending from the housing 114, which is preferably configured to support the circuit board 108, as well as to function as a heatsink to the components of the circuit board 108 and the electronic components 116 (discussed below). It will be appreciated that the opposite side of the unit 100 (not shown) may mirror the side shown in the three-dimensional views of FIGS. 1 and 2, i.e., a second circuit board having another visible LED and dual IR LEDs. FIG. 3B, however, provides a front view of the dual-illumination unit 100, wherein each side of the unit is visible, e.g., circuit boards 108 affixed to the LED tower 118 are readily discernible, along with the various LEDs 102-106. Although not depicted in FIGS. 1-3E, the circuit board 108 (and corresponding LEDS 102-106) may be encapsulated in glass or clear plastic to protect the components therein, as would be accomplished with traditional halogen or Xenon bulbs.

According to one embodiment, the printed circuit board 108 may include one high-powered white LED 102 and two (or more) 940 nm IR LEDs 104-106. In accordance with one particular embodiment, the white LED 102 utilized is selected to most closely match OEM light sources in color temperature and brightness, e.g., 55 watt halogen bulbs, commonly installed in vehicles. It will be understood by those skilled in the art that the reference herein to white LEDs and IR LEDs is intended to exemplify the use of visible illumination sources combined with non-visible illumination sources, and that the subject embodiments are capable of implementation utilizing other wavelengths of visible light and other wavelengths of non-visible light other than the white and infrared wavelengths contemplated herein. The skilled artisan will also appreciate that other IR LEDs may be used, including, for example and without limitation, LEDs illuminating in the near infrared range, e.g., range of 700 nm to 1600 nm wavelengths, or the like. It will further be appreciated that the non-visible light sources selected may correspond to the type of night-vision viewer available, e.g., older devices may require 850 nm, and potentially newer devices may require 1550 nm. Furthermore, it will be understood that the non-visible light source may be selected for any wavelength in the infrared spectrum (700 nm to 1 mm), e.g., near-infrared (700 nm-1600 nm), short-wavelength infrared (1400 nm-3000 nm), mid-wavelength infrared (3000 nm-8000 nm), long-wavelength infrared (8000 nm-15000 nm), and far infrared (15000 nm-1 mm). Non limiting examples of non-visible IR sources, such as OLEDs, PLEDs, Laser SMDs, non smd-LEDs, and the like, may be implemented herein to produce the desired illumination wavelength.

In addition to the foregoing, it should be understood that the number of LEDs 102-106 illustrated and discussed herein are for purposes of example only. It will be understood that the dual-illumination unit 100 may utilize any suitable number of white LEDs 102, and any suitable number of IR LEDs 104-106, as required for producing the necessary visible and IR illumination. Accordingly, the dual-illumination unit 100 is not intended to be limited to a single white LED 102 and two IR LEDs 104-106.

Furthermore, it will be understood that the embodiments disclosed herein incorporate the white LEDs 102 to replace the original OEM bulbs when standard lighting is required during driving scenarios, while allowing covert IR capability without substantial modification to the vehicle, or disclosing the capability to an observer. Accordingly, the unit 100 effectively conceals the IR output by reducing the direct sight path of the visible red glow (inherent in some IR LEDs) and using the design of the headlight assembly to "throw" the IR light output at a focused and increased distance beyond an exposed IR LED. FIGS. 7-7B, discussed in greater detail below, illustrate this output in an example implementation.

The dual-illumination unit 100 of FIGS. 1-3E further includes the aforementioned adapter ring 112, removably coupled to the dual-illumination unit 100. In varying embodiments contemplated herein, the adapter ring 112 is configured to secure the dual-illumination unit 100 to an associated vehicle. It will be understood that the adapter ring 112 is contemplated to be removably attached to the unit 100. For example and without limitation, various adapter rings 112 for different vehicles may be utilized to enable the unit 100 to be secured to such vehicles.

It will be understood that while depicted as a replacement for a standard H4 bulb in the FIGURES attached hereto, the adapter ring 112 may be configured to replicate any suitable OEM automotive lightbulb connection component that is used in automotive lighting to secure the bulb to the vehicle. Thus, it will be appreciated that the use of an H4 adapter ring, as illustrated in FIGS. 1-3E is intended to explain, and not limit, the use of the dual-illumination unit 100. Furthermore, in varying embodiments contemplated herein, multiple different adapters may be included with the unit 100 when deployed in the field, enabling the soldier or other operator to utilize the unit 100 in myriad vehicles encountered during operations. Accordingly, the ring 112 may be of different sizes and shapes so as to mimic other types of OEM automotive bulbs found in vehicles throughout the world. That is, the adapter ring 112 is implemented to match the keys and openings in various headlight/foglight bulb locations.

Figure 3A:
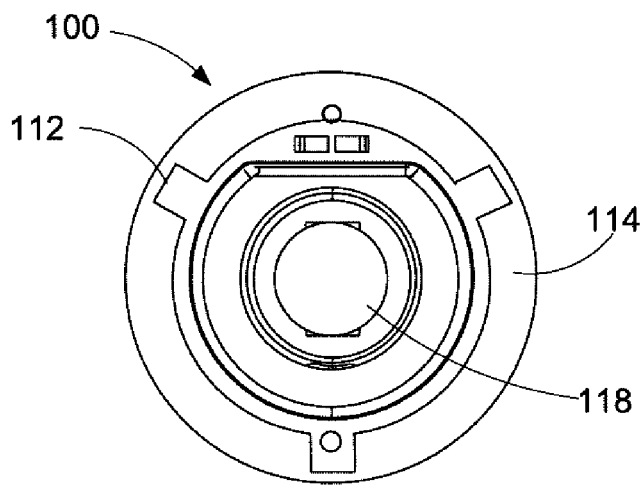
FIG. 3A illustrates a top view of one embodiment of a dual-illumination unit in accordance with the subject application.
Figure 3B:
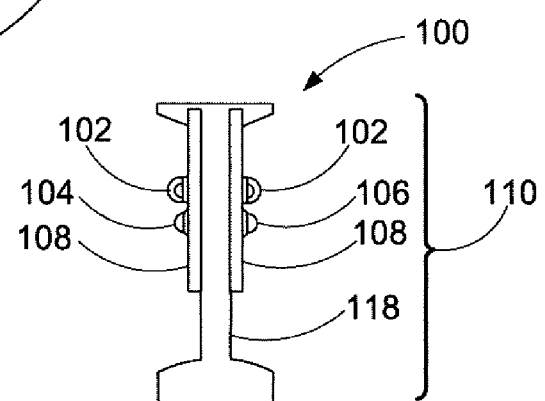
FIG. 3B illustrates a side view of the embodiment of the dual-illumination unit of FIG. 3A in accordance with the subject application.
Figure 3B:
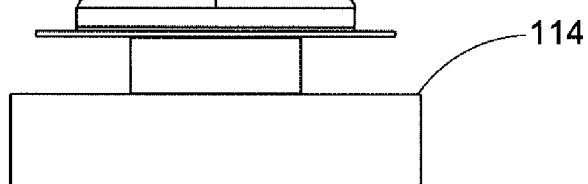

As indicated above, the dual-illumination unit 100 further includes a housing 114, to which the adapter ring 112 and printed circuit board(s) 108 with LEDs 102-106 are attached. Preferably, the adapter ring 112 is threaded, clipped, or otherwise secured to the housing 114, allowing the operator to remove and replace the ring 112 as needed. For example, the adapter ring 112 may be twisted clockwise to secure the ring 112 to the housing 114, and twisted counter-clockwise to remove the ring 112 from the housing 114. FIG. 3A, in particular, provides an exemplary top view of the unit 100, wherein the adapter ring 112 is removably attached to the housing 114. The housing 114 may be comprised of a suitable material that is durable and rugged in nature to prevent damage while transporting to an associated, or installed within a vehicle, as well as to support the various electronics of the board 108 and LEDs 102-106. Suitable materials include, for example and without limitation, metals, metal alloys, ceramics, plastics, or various combinations thereof.

Figure 3C:
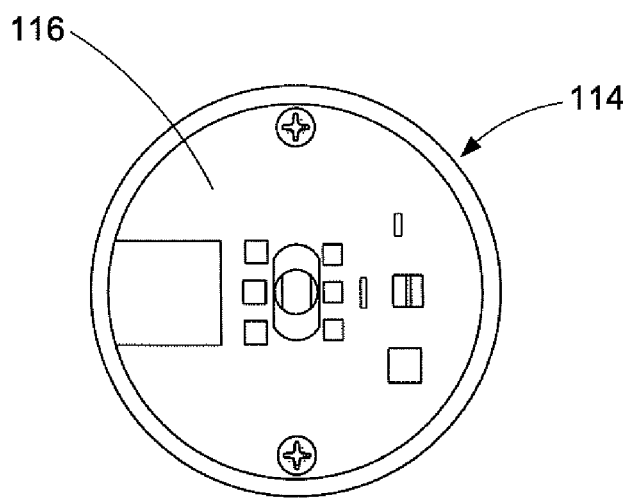
FIG. 3C illustrates a bottom view of the embodiment of the dual-illumination unit of FIG. 3A in accordance with the subject application.
Figure 3D:
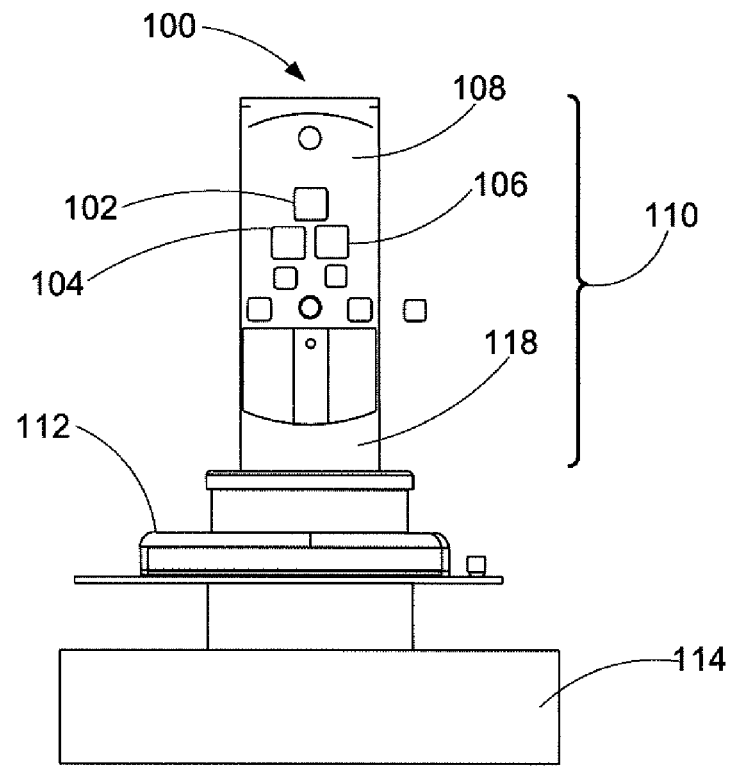
FIG. 3D illustrates a front view of the embodiment of the dual-illumination unit of FIG. 3A in accordance with the subject application.
Figure 3E:
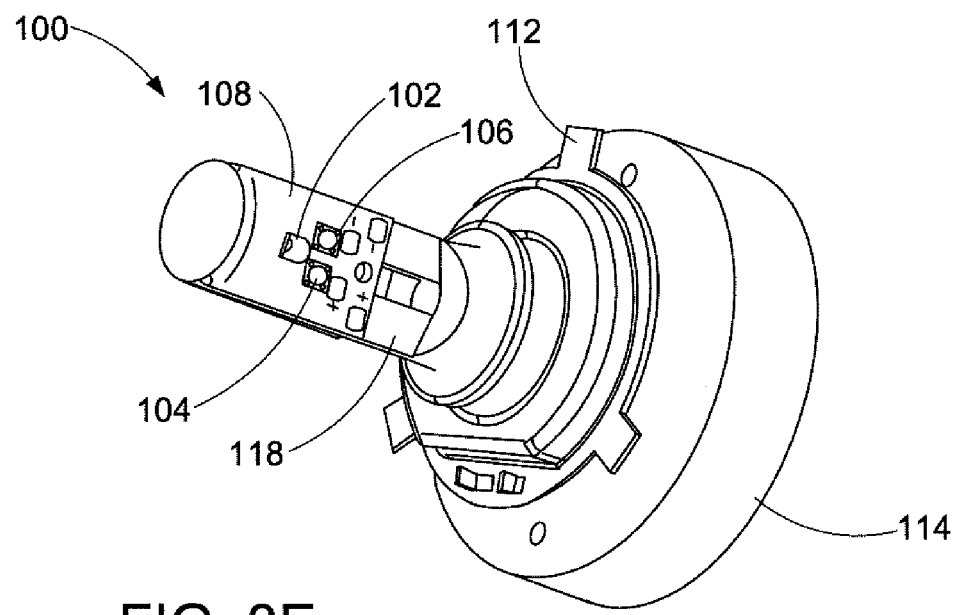
FIG. 3E illustrates a three-dimensional view of the embodiment of the dual-illumination unit of FIG. 3A in accordance with the subject application.

In accordance with one embodiment, the material of the housing 114 is configured to not only support the circuit board 108 and adapter ring 112, but also house electronic components 116 allowing the unit 100 to function utilizing the standard 12V electrical system of civilian vehicles. It will be appreciated that the electronic components 116, as discussed below and illustrated in the housing 114 of FIG. 3C, are packaged within the housing 114 for concealment and environmental protection.

Figure 8:
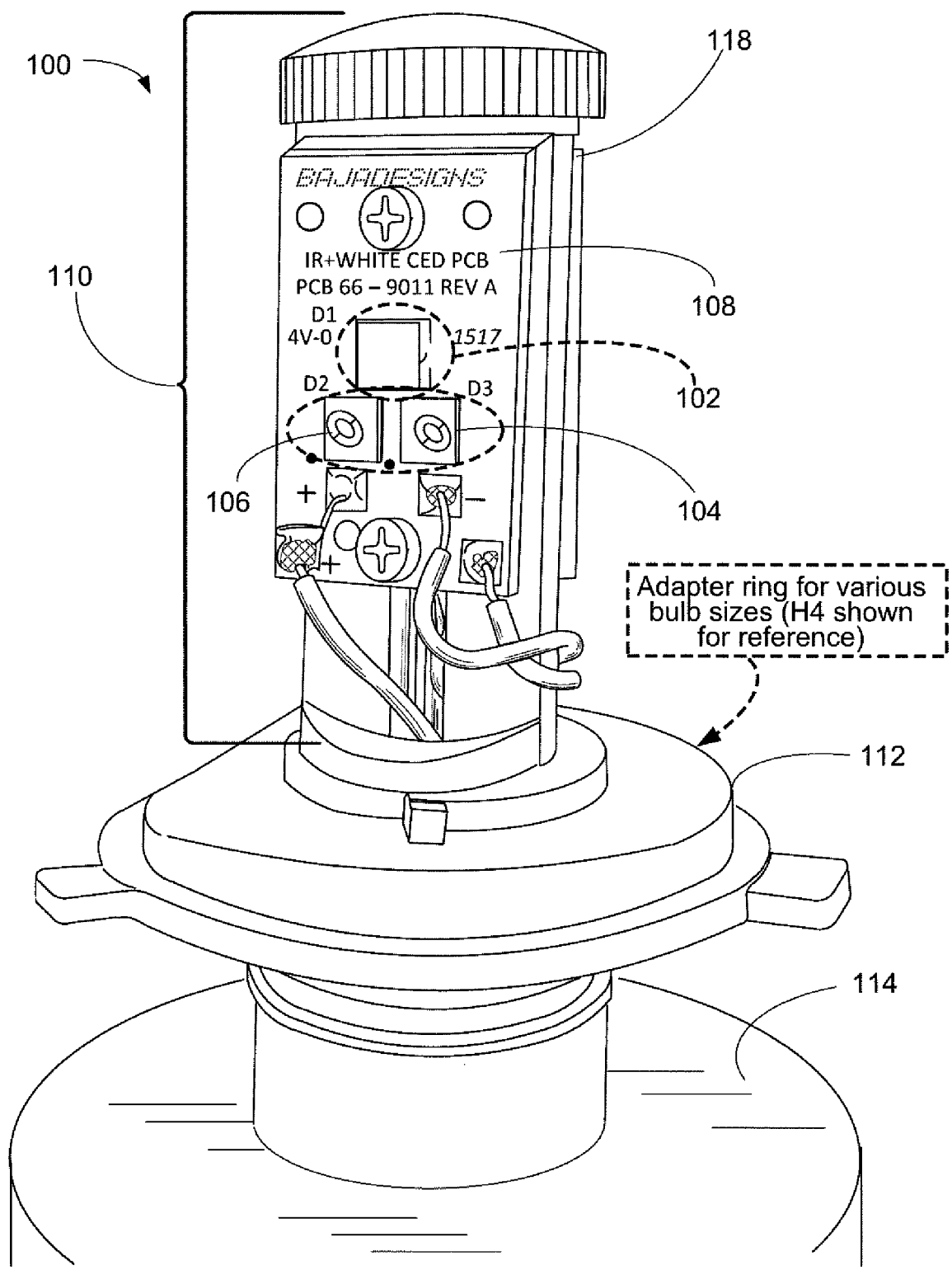
FIG. 8 is a photograph of the dual-illumination unit of FIG. 6 in accordance with one embodiment of the subject application.
Figure 9:
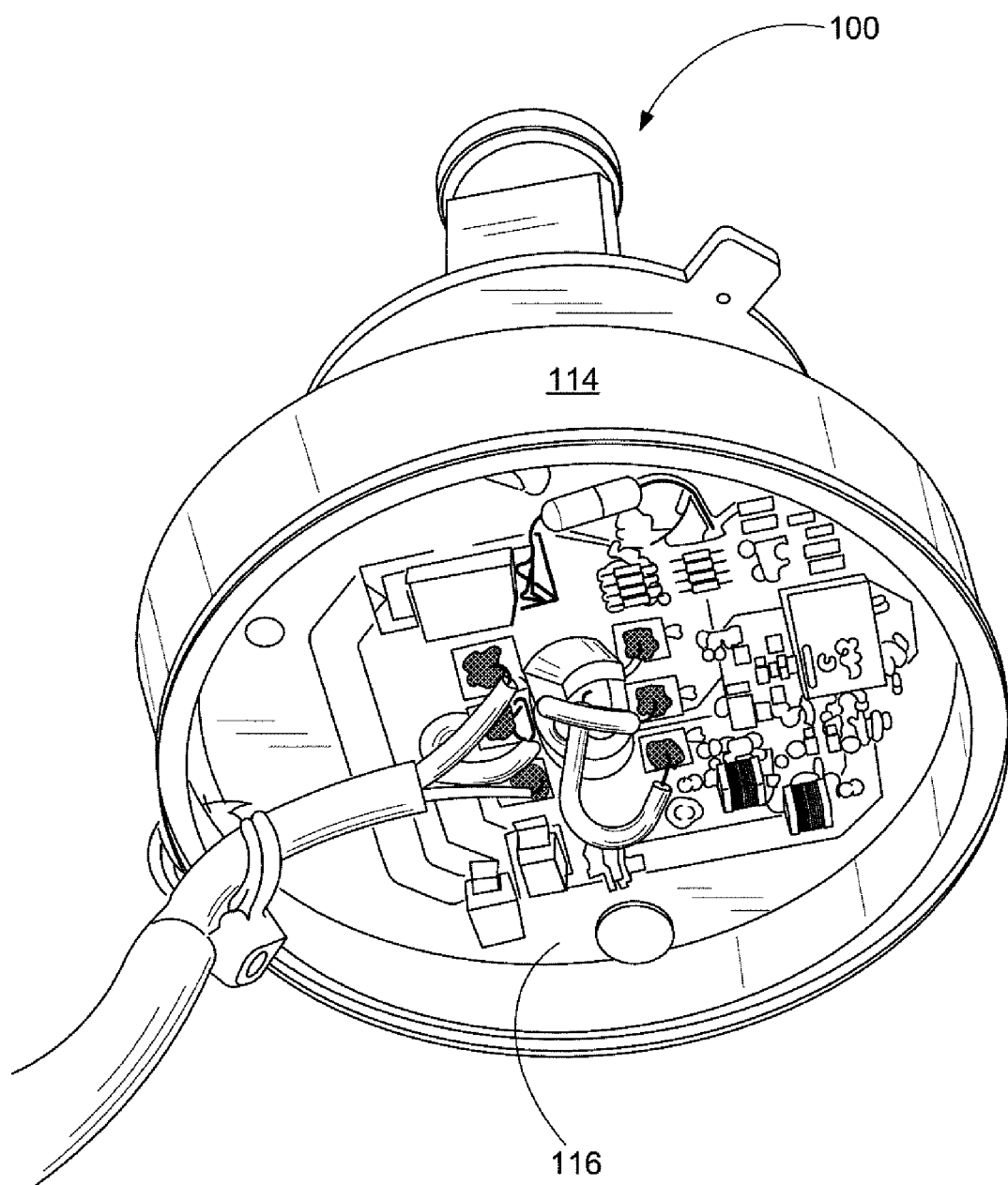
FIG. 9 is a photograph of the dual-illumination unit of FIG. 6 in accordance with one embodiment of the subject application.

As shown in FIGS. 1-3E, the example implementation of the housing 114 is metallic in composition, e.g., aluminum, providing additional benefits to the unit 100 during operations. FIGS. 8 and 9, discussed below, provide photographic illustrations of one example embodiment of the dual-illumination unit 100 utilizing the aforementioned metallic housing 114. It will be appreciated that the electronics 116 generate a non-negligible amount of waste heat, converting the power from the associated vehicle to power to the LEDs 102-106. Accordingly, the metallic nature of the housing 114 functions as a heat sink to radiate such heat away from the electronics 116, providing a passive cooling mechanism thereto. As will be understood by those skilled in the art, previous IR light assemblies generated a substantial amount of noise from active cooling units, further limiting implementation in standard OEM light assemblies, as enabled by the subject dual-illumination unit 100.

Figure 4:
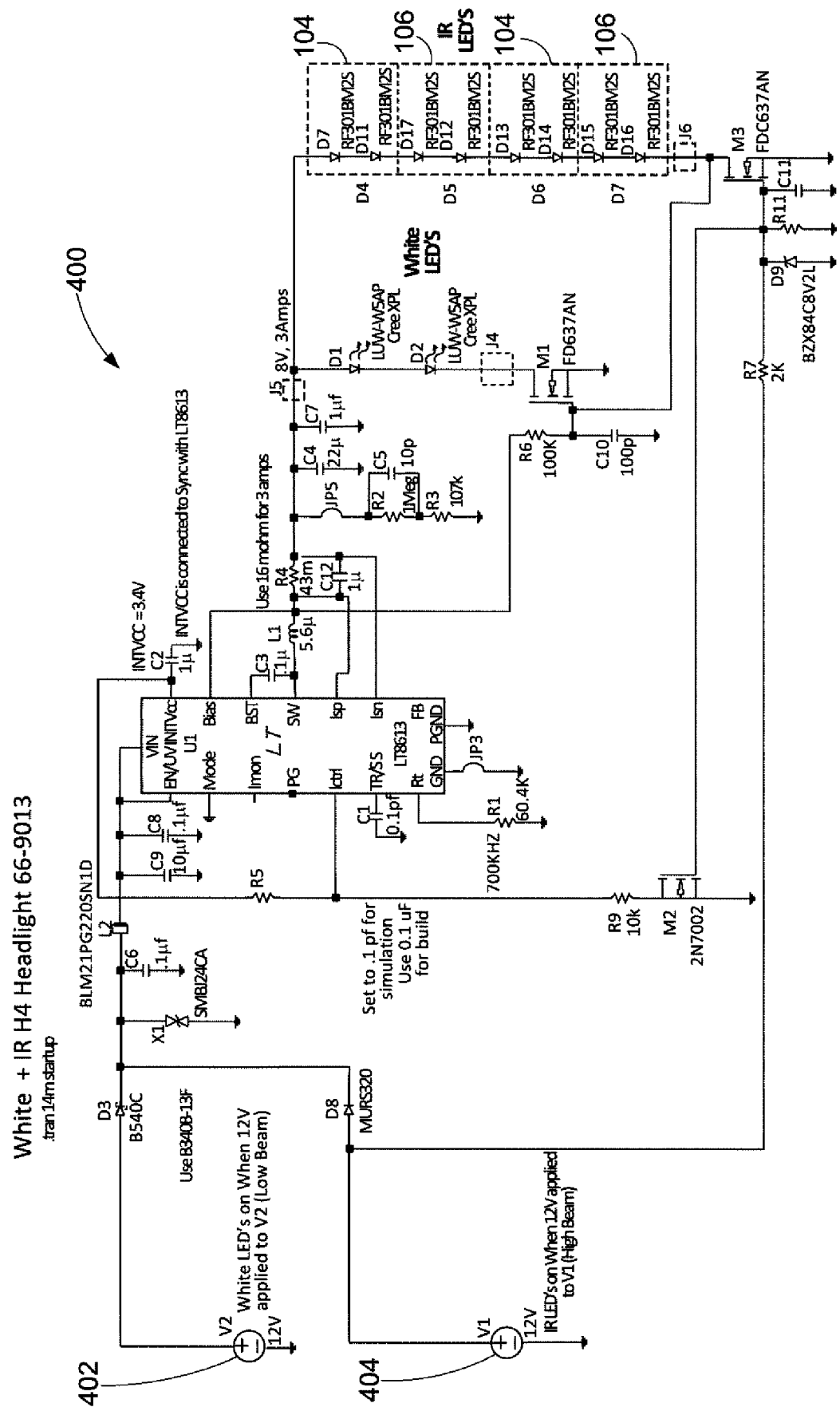
FIG. 4 is a schematic diagram of control circuitry of a dual-illumination unit in accordance with one embodiment of the subject application.

In accordance with one embodiment, the electronic components 116 (e.g., driver circuits, controls, etc.) are suitably configured to control operations of the LEDs 102-106, modify the voltage and/or amperage directed to the LEDs 102-106, which require less power than the typical halogen or Xenon lights being replaced. FIG. 4 provides a schematic circuit diagram 400 of the electronic components 116 utilized in accordance with one exemplary embodiment of the subject application. As shown in FIG. 4, the electronic components 116 are suitably configured to regulate the voltage/amperage provided to the LEDs 102-106, switch between LEDs 102 and 104-106, and the like.

Figure 5:
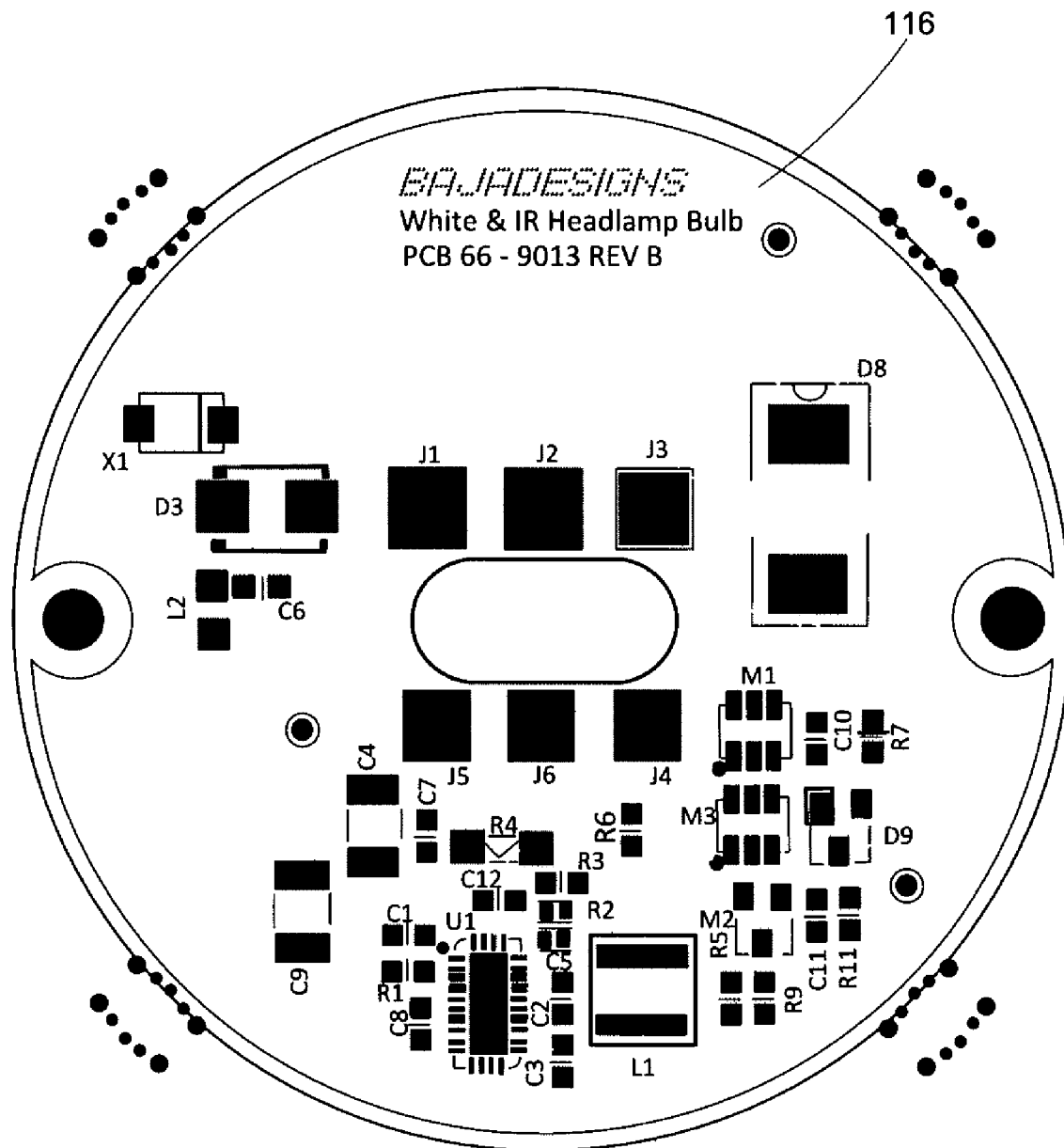
FIG. 5 is a representative illustration of the control circuitry of the dual-illumination unit of FIG. 4 in accordance with one embodiment of the subject application.

With respect to FIG. 4, the electronic components 116 connect both printed circuit boards 108 of the unit 100, i.e., two white LEDs 102, and four IR LEDs 104-106, shown on the left of the diagram 400. Furthermore, as illustrated in FIG. 4, the operations of the white LEDs 102 is controlled via activation of the low beams of the headlights (shown at 402) and the IR LEDs 104-106 are operable upon activation of the high beams of the headlights (shown at 404). It will therefore be appreciated that the existing passenger compartment controls (e.g., headlight/taillight switch) may be utilized to switch between visible and IR illumination, i.e., a low-beam mode (visible light) and a high-beam mode (IR illumination). The skilled artisan will appreciate that the use of the headlight switch is representative of one possible control switch for the dual-illumination unit 100, and other vehicle control switches are capable of being used, e.g. interior light switch, heater/AC controls, fog lights, or the like. Furthermore, those of skill in the art will understand that a separate control switch/unit (not shown), may be affixed into the vehicle cabin to control the dual-illumination unit 100, e.g., a wired or wireless switch (with suitable communications components at the dual-illumination unit 100 and switch), may be externally switched, a combination thereof, or the like. Accordingly, the electronic components 116 depicted in FIG. 4 are operative to receive an input signal, i.e., power at 402 or 404, to actuate the corresponding LEDs, i.e., 102 or 104-106. FIG. 5 provides an example diagram of the electronic components 116 located within the housing 114. As illustrated in FIG. 5, the various components of the schematic 400 are implemented on a printed circuit board 500. It will be appreciated that the various electrical components shown in FIG. 5 are represented by corresponding labels in FIG. 4.

In varying embodiments contemplated herein, the electronic components 116 may be configured to connect (not shown) to standard automotive OEM wiring harnesses, allowing for quick installation thereof, in addition to allowing the operator to switch between the white LEDs 102 and the IR LEDs 104-106 via the normal light controls of an associated vehicle. For example, the wiring harness may be configured in conjunction with the electronics 116 to operate the white LEDs 102 when the lights of the vehicle are activated while disabling the white LEDs 102 and enabling the IR LEDs 104-106 when the operator selects the hi-beam mode or "bright" lights. It will be appreciated that the inclusion of the electronics 116 within the housing 114 negates the need to modify the vehicle electronics, as well as allowing the operator to utilize a self-contained unit 100, as opposed to multiple components requiring assembly in the field.

Figure 6:
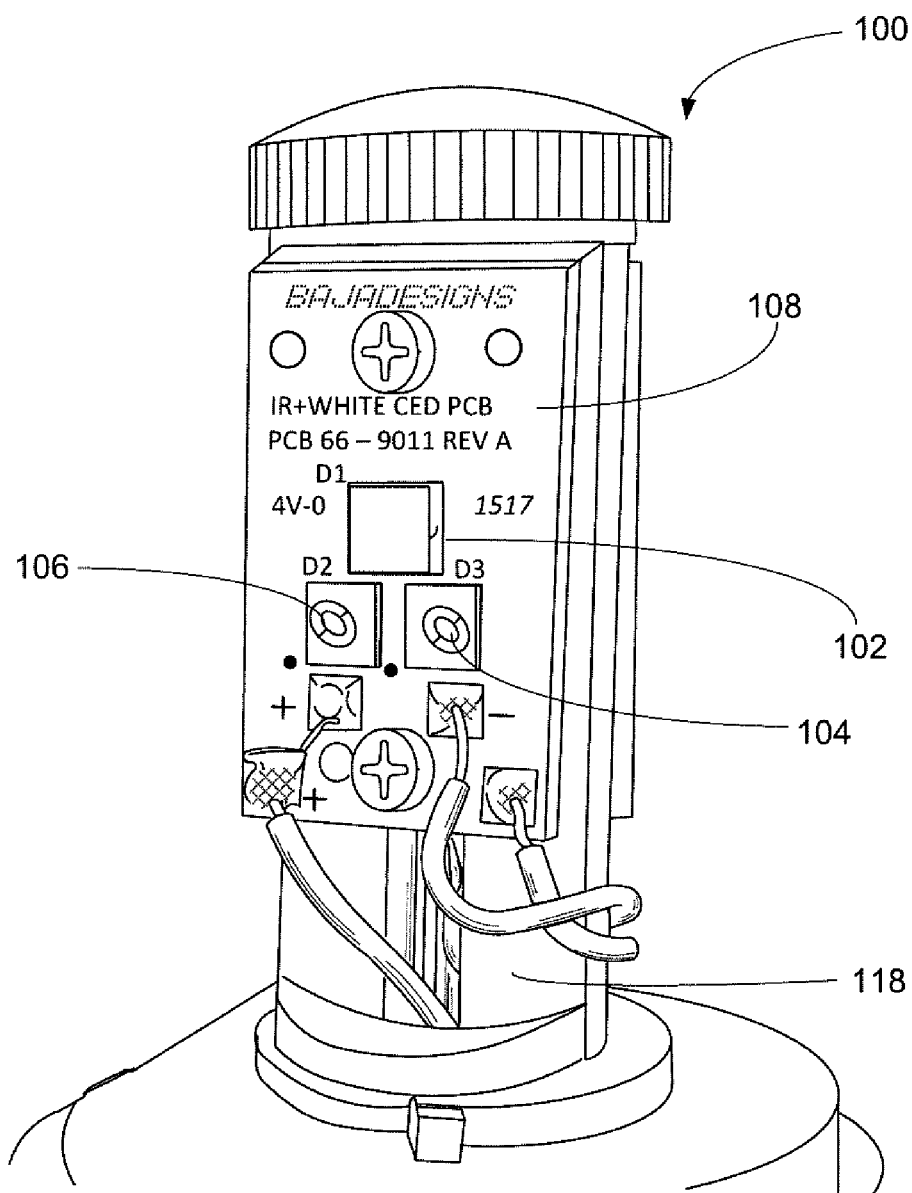
FIG. 6 is a photograph of a dual-illumination unit in accordance with one embodiment of the subject application.

Referring now to FIG. 6, there is shown a close-up photographic view of the dual-illumination unit 100 of the subject application. In particular, FIG. 7 depicts one side of the dual-illumination unit 100, including the first LED 102 for visible illumination and the two infrared LEDs 104-106 for infrared illumination coupled to the circuit board 108. It will be understood that the opposite side of the unit 100 mirrors the side shown in FIG. 7. Furthermore, in the embodiment shown in FIG. 6, the printed circuit board 108 includes one high-powered white LED 102 and two 940 nm IR LEDs 104-106.

As shown in FIG. 6, the dual-illumination unit 100 is implemented to resemble a standard H4 automotive replacement bulb. This implementation facilitates the subterfuge intended in use of IR illumination, without the need to reconfigure or switch out the light.

Figure 7A:
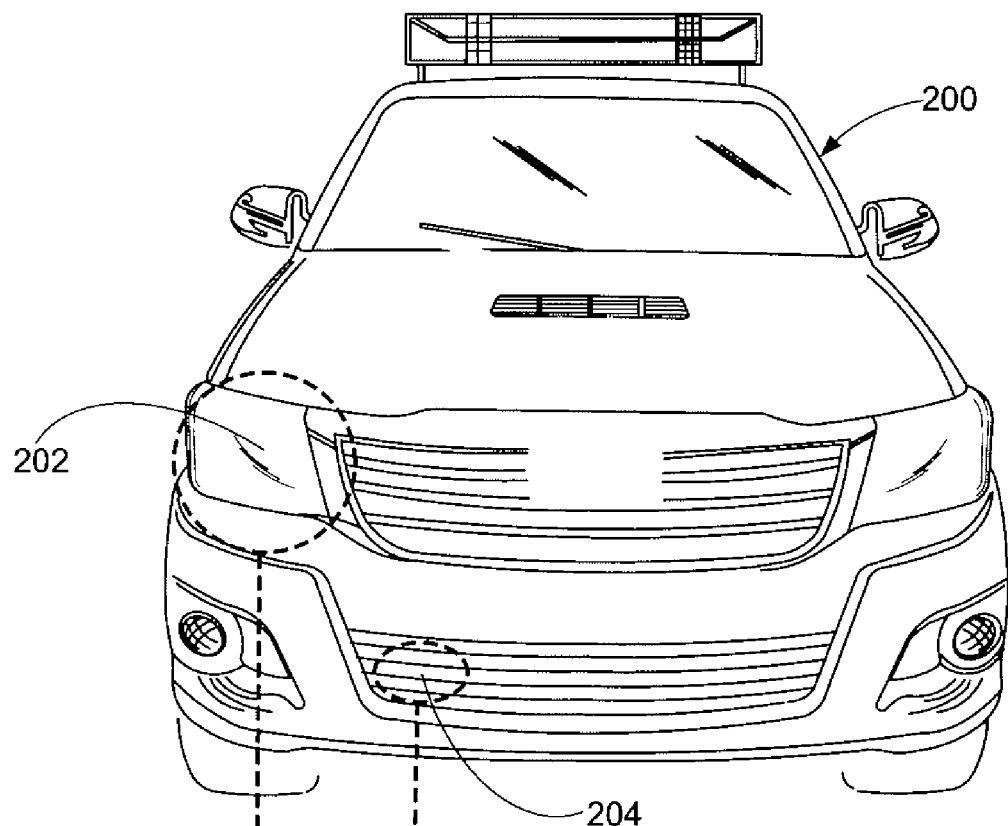
FIG. 7A is a photograph of an associated vehicle employing the dual-illumination unit in accordance with one embodiment of the subject application.
Figure 7B:
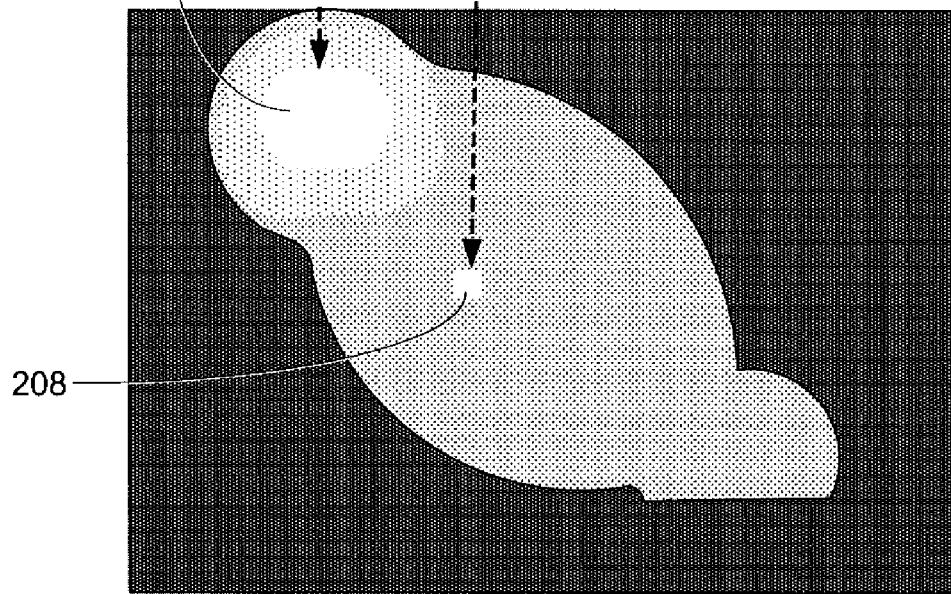
FIG. 7B is a photograph of the associated vehicle of FIG. 7A in which the dual illumination unit is activated.

As shown in FIG. 7A, a non-military vehicle 200 is photographed representative of an OEM platform in which the unit 100 may be installed. The vehicle 200 includes a standard headlight assembly 202 and exposed assembly 204, circled in the photograph of FIG. 7A. FIG. 7B provides a photographic illustration of the standard headlight assembly 202 (with unit 100 installed and IR LEDs 104-106 illuminated) and the exposed assembly 204 (with the IR LEDs illuminated) when activated, with the resultant output illustrated in the image depicted therein below respectively at 206 and 208. It will be appreciated that while the same IR LEDs are used in both 202 and 204, the apparent illumination 206 and 208 is readily distinguishable as a result of the installation of the unit 100 in the assembly 202 (further illustrated in FIG. 11 discussed below), as opposed to the exposed installation of the unit 100 at 204.

Turning now to FIGS. 8 and 9, there are shown further photographs of the dual-illumination unit 100 in accordance with one embodiment of the subject application. As shown in FIGS. 8-9, the dual-illumination unit 100 includes the removable adapter ring 112 configured to secure the unit 100 in an OEM light assembly 202 (shown in greater detail in FIG. 11).

Figure 10:
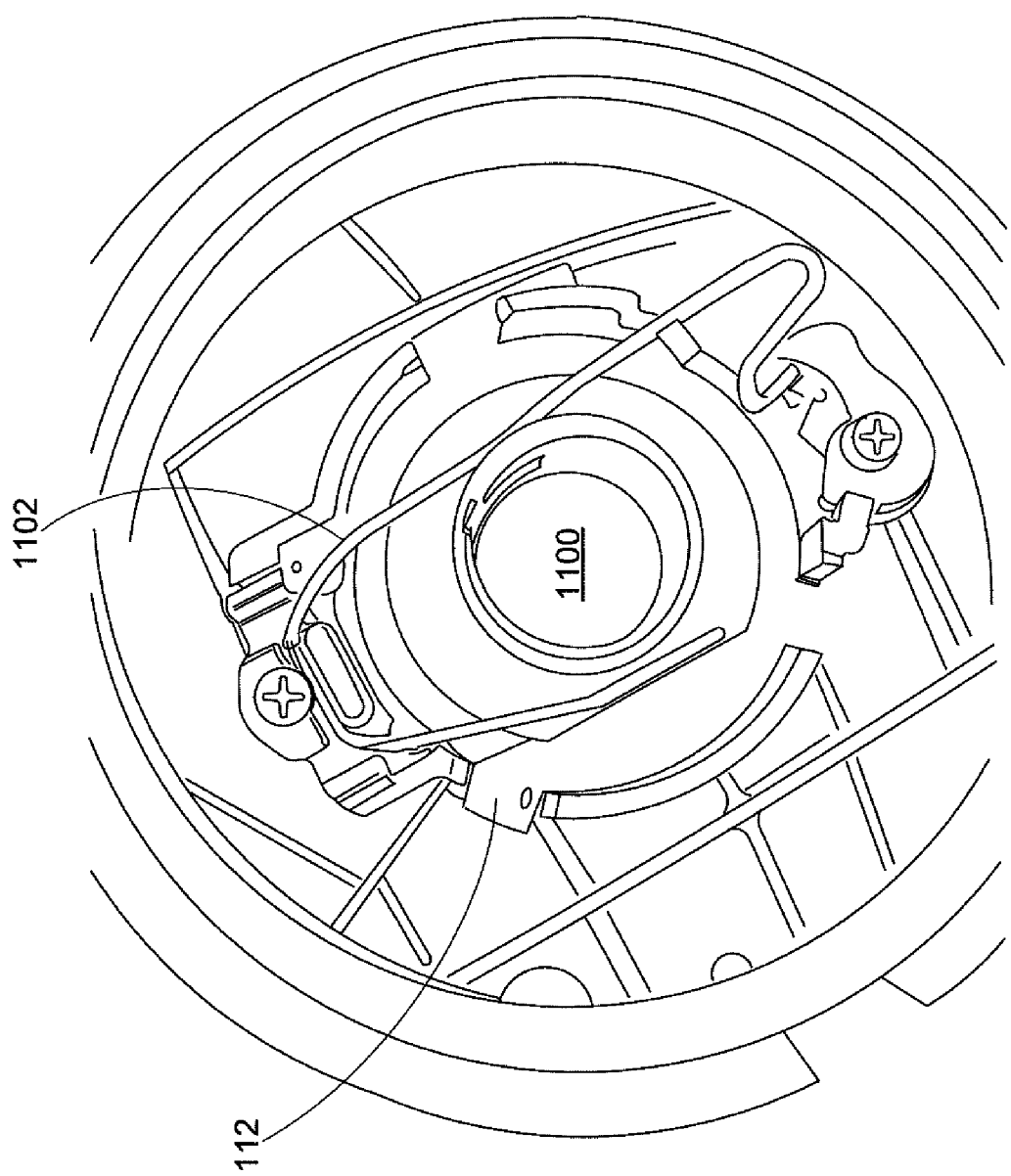
FIG. 10 is a photographic illustration of an empty headlight assembly into which the dual-illumination unit is to be inserted in accordance with one embodiment of the subject application.
Figure 11:
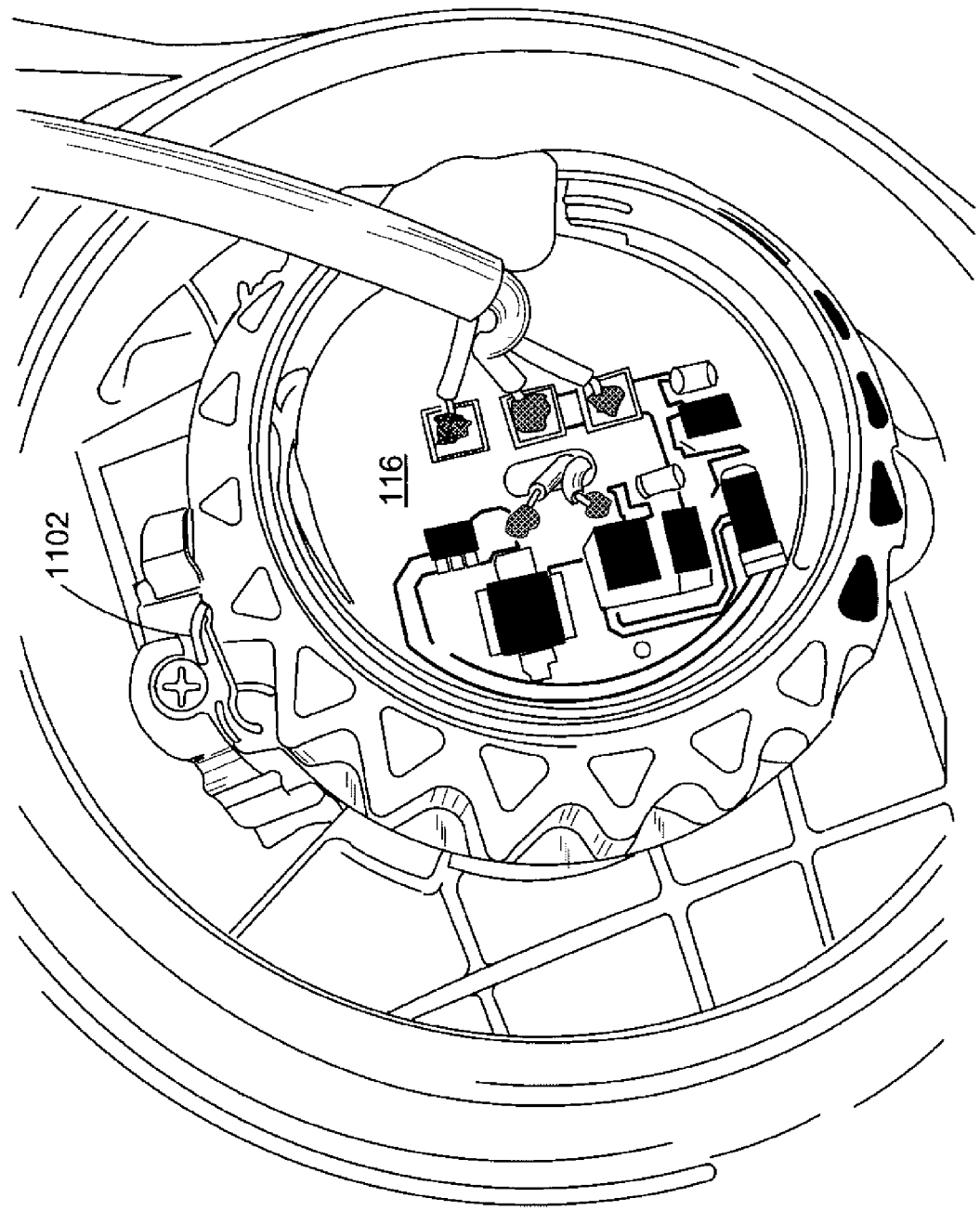
FIG. 11 is a photographic illustration of the bottom of a dual-illumination unit mounted in the headlight assembly of FIG. 10 on a vehicle according to one embodiment of the subject application.

The dual-illumination unit 100 illustrated in FIGS. 8-9 further depicts the housing 114, to which the adapter ring 112 and printed circuit board(s) 108 with LEDs 102-106 are attached. As shown in FIGS. 8 and 9, the example implementation of the housing 114 is an aluminum housing, providing support for the illumination component 110, the adapter ring 112, and heatsink capabilities for the electronic components 116 housed therein. FIG. 10 is a photograph illustrating the empty socket 1100 into which the dual-illumination unit 100 is to be inserted on an associated headlight assembly of a vehicle. The assembly includes the adapter ring 112 retained by flange 1102 configured to receive the adapter ring 112, thereby securing the unit 100 within the assembly. It will be appreciated that the photograph of FIG. 10 is representative of one possible headlight assembly into which the unit 100 may be inserted. Other assemblies, e.g., positions on the vehicle, as well as types of vehicles, may utilize different retention mechanisms than the flange 1102 shown in FIG. 10, e.g., the adapter ring 112 may be rotated (screwed/twisted) into locking tabs of the assembly (not shown). FIG. 11, thereafter, shows the inserted dual-illumination unit 100, retained by the adapter ring 112 interacting with the flange 1102.

Figure 12:
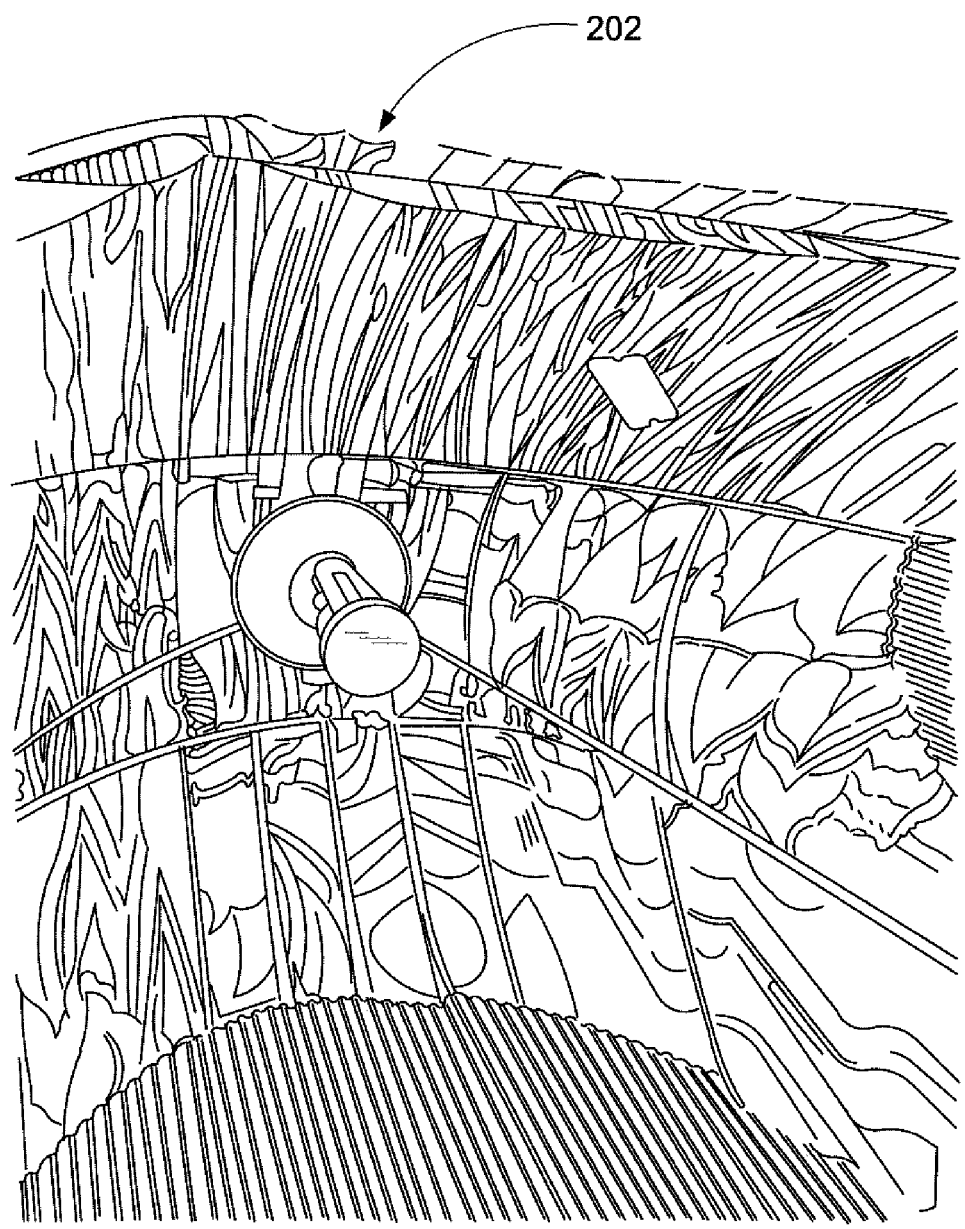
FIG. 12 is a photograph of a front view of the headlight assembly of FIG. 10 utilizing the dual-illumination unit in accordance with one embodiment of the subject application.

FIG. 12 provides a close-up photograph of the OEM headlight assembly 202 in which the dual-illumination unit 100 is emplaced. As shown in FIG. 12, the dual-illumination unit 100 closely resembles the standard OEM lightbulb that would otherwise be used by the associated vehicle 200. It will be appreciated that the visible and IR light provided by the dual-illumination unit 100 are reflected in the same manner as the aforementioned standard lightbulb by the OEM assembly 202.

It is to be appreciated that in connection with the particular illustrative embodiments presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that particular elements or components described herein may have their functionality suitably implemented via hardware, software, firmware or a combination thereof. Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to preferred embodiments. Obviously, modifications and alterations will occur to others upon reading and understanding the present specification. It is intended that the invention be construed as including all such modifications and alterations insofar as they come within the scope of the appended claims or the equivalents thereof. That is to say, it will be appreciated that various of the above-disclosed and other features and functions, or alternatives thereof, may be desirably combined into many other different systems or applications, and also that various presently unforeseen or unanticipated alternatives, modifications, variations or improvements therein may be subsequently made by those skilled in the art which are similarly intended to be encompassed by the following claims.

We claim:

1. A dual-illumination unit, comprising:
an illumination component including at least one visible light LED and at least one non-visible LED; and
a housing to which the illumination component is affixed on a first side, the housing storing at least one electronic component on a second side, opposite the side to which the illumination component is affixed and operable to control operations of the at least one visible light LED and the at least one non-visible LED,
wherein the at least one electronic component is operable to receive control signals from an associated vehicle, the control signal corresponding to a low-beam and a high-beam signals,
wherein the at least one electronic component actuates the at least one visible light LED responsive to a low-beam signal or a high-beam signal, and wherein the at least one electronic component actuates the at least one non-visible LED responsive to the low-beam signal or the high-beam signal opposite an actuation signal of the at least one visible light LED.

2. The dual-illumination unit of claim 1, wherein the illumination component includes at least one circuit board.

3. The dual-illumination unit of claim 2, wherein the at least one visible light LED and the at least one non-visible LED are affixed to the at least one circuit board.

4. The dual-illumination unit of claim 2, wherein the at least one circuit board is coupled to an LED tower, the LED tower extending upward from the housing.

5. The dual-illumination unit of claim 1, wherein the electronic components are configured to regulate at least one of a voltage or an amperage provided to the at least one visible light LED and the at least one non-visible LED.

6. The dual-illumination unit of claim 1, wherein the at least one visible light LED is a white LED.

7. The dual-illumination unit of claim 1, wherein the at least one non-visible light LED outputs infrared (IR) light in at least one of the range of 850 nm through 1550 nm.

8. The dual-illumination unit of claim 1, wherein the housing is configured as a heatsink for the electronic components.

9. A dual-illumination unit, comprising:
a housing, the housing storing at least one electronic component operable to control operations of the dual-illumination unit; and
an LED tower extending outward from the housing, the LED tower having at least one circuit board affixed thereto,
wherein the at least one circuit board includes at least one visible light LED and at least one infrared LED,
wherein the at least one electronic component is located opposite a side of the housing from which the LED tower extends,
wherein the at least one electronic component is communicatively coupled to a control of an associated vehicle, the control operable to actuate the dual-illumination unit,
wherein the control of the associated vehicle corresponds to a headlight mode of operation including a low-beam mode and a high-beam mode,
wherein the at least one electronic component actuates the at least one visible light LED responsive to at least one of a low-beam mode or a high-beam mode, and
wherein the least one electronic component actuates the at least one IR LED responsive to at least one of the low-beam mode or the high-beam mode opposite an actuation mode of the at least one visible light LED.

10. The dual-illumination unit of claim 9 wherein the at least one electronic component is configured to regulate at least one of a voltage or an amperage provided to the at least one visible light LED and the at least one infrared LED.

11. The dual-illumination unit of claim 10, wherein the at least one visible light LED is a white LED, and wherein the at least one IR light LED outputs IR light in at least one of the range of 850 nm to 1550 nm.

12. A dual-illumination unit, comprising:
at least one circuit board including at least one visible light LED and at least one infrared (IR) LED;
an LED tower to which the at least one circuit board is affixed;
a housing coupled to the LED tower, the housing storing a control circuit board to which at least one electronic component is affixed and operable to control operations of the at least one visible light LED and the at least one IR LED, wherein the control circuit board is located opposite a side of the housing to which the LED tower is affixed; and
wherein the at least one electronic component is operable to receive control signals from an associated vehicle, the control signal corresponding to a low-beam and a high-beam signals,
wherein the at least one electronic component actuates the at least one visible light LED responsive to at least one of a low-beam signal or a high-beam signal, and
wherein the at least one electronic component actuates the at least one IR LED responsive to the low-beam signal or the high-beam signal opposite an actuation signal of the at least one visible light LED.

13. The dual-illumination unit of claim 12, wherein the at least one electronic component is configured to regulate at least one of a voltage or an amperage provided to the at least one visible light LED and the at least one infrared LED.

* * * * *